United States Patent [19]

Simmonds et al.

[11] 4,389,612
[45] Jun. 21, 1983

[54] APPARATUS FOR REDUCING LOW FREQUENCY NOISE IN DC BIASED SQUIDS

[75] Inventors: Michael B. Simmonds, Del Mar; Robin P. Giffard, Palo Alto, both of Calif.

[73] Assignee: S.H.E. Corporation, San Diego, Calif.

[21] Appl. No.: 160,225

[22] Filed: Jun. 17, 1980

[51] Int. Cl.³ ............................................. G01R 33/02
[52] U.S. Cl. ..................................................... 324/248
[58] Field of Search ......................... 324/248; 307/306

[56] References Cited
U.S. PATENT DOCUMENTS
3,528,005  9/1970  Morse et al. ......................... 324/248

Primary Examiner—Gerard R. Strecker
Assistant Examiner—Walter E. Snow
Attorney, Agent, or Firm—Christie, Parker & Hale

[57] ABSTRACT

A circuit for reducing low frequency noise in a direct current biased superconducting quantum interference device. A squarewave bias signal having no dc component is used to bias the two junctions of the dc SQUID. At the same time, the magnetic flux in the SQUID is modulated to heterodyne the input signals up to some convenient frequency where they may be amplified without concern for drift. Final demodulation automatically adjusts for the fact that the relative phase is reversed each time the squarewave bias changes polarity states.

15 Claims, 5 Drawing Figures

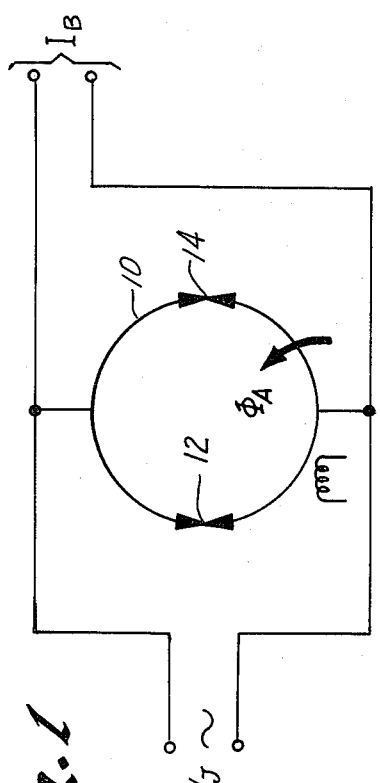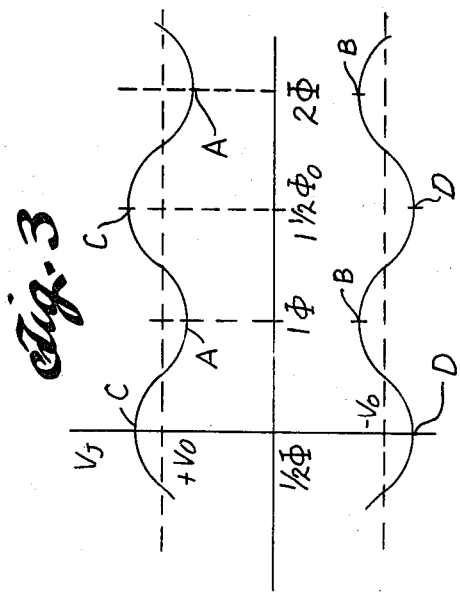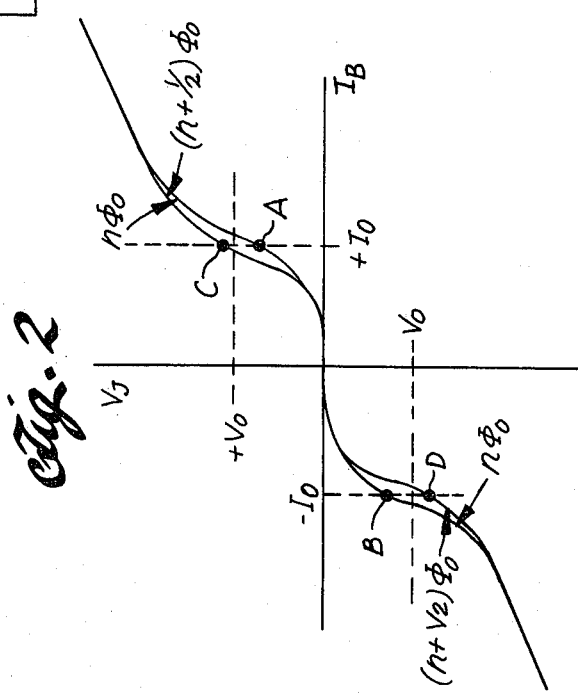

APPARATUS FOR REDUCING LOW FREQUENCY NOISE IN DC BIASED SQUIDS

FIELD OF THE INVENTION

This invention relates to measuring circuits using superconducting quantum interference devices (SQUID), and more particularly, to a biasing arrangement for reducing low frequency noise.

BACKGROUND OF THE INVENTION

Quantum interference effects in superconducting rings containing one or two Josephson junctions are well known. Devices exhibiting these effects, known as superconducting quantum interference devices or SQUIDS, have been used, for example, in the measurement of magnetic fields and voltages. Both dc SQUIDS using two Josephson junctions connected in a superconducting ring and RF SQUIDS incorporating a single junction in a superconducting ring have been used for making such measurements. Such dc SQUIDS have recently been constructed using thin film Josephson junctions having oxide or semiconductor barriers. Such dc SQUIDS have been shown to have advantages in regard to magnetic energy sensitivity compared to the RF SQUID. The construction and operation of tunnel junction dc SQUIDS is described in detail in the article "Tunnel Junction dc SQUID: Fabrication, Operation, and Performance" by Clarke, Goubau, and Ketchen, *Journal of Low Temperature Physics*, Vol. 25, Nos. 1/2, 1976, pp. 99–143.

Recent efforts at obtaining improved energy sensitivity have involved the use of very small area junctions which, because of their relatively low capacitance, make possible higher resistance SQUIDS. Such small area junctions (approximately $1\mu$ diameter) are able to operate in the earth's ambient field, thus avoiding the problem of providing a low field environment.

The principal problem with these small area junctions has been their tendency to exhibit a large amount of low frequency noise having a 1/f energy spectral density. This effect has been observed and analyzed as resulting from the thermodynamic temperature fluctuations in the superconducting material on either side of the junctions. The amplitude of these fluctuations is inversely proportional to the volume of material so that the smaller the junction, the greater the amplitude of these fluctuations. These temperature fluctuations produce variations in the effective operating resistance of the junctions, and since a dc bias is normally impressed across the junctions, these resistance changes give rise to fluctuations in the partitioning of the dc bias current between the two junctions. These current fluctuations, in turn, result in fluctuations in the magnetic flux coupled to the SQUID having the same 1/f spectral distribution as the original temperature fluctuations.

SUMMARY OF THE INVENTION

The present invention is directed to a biasing arrangement for a dc SQUID which removes from the output signal of the SQUID substantially all 1/f (low frequency) noise associated with the dc bias. Thus the circuit is able to extend the high frequency sensitivity of very small area thin film junctions to much lower frequencies than has been possible using conventional biasing methods. This is achieved, in brief, by providing a biasing circuit for a dc SQUID having a pair of thin film Josephson junctions connected in a superconducting ring wherein a bias current somewhat greater than the critical current of the SQUID is caused to flow through the two junctions in parallel alternately in one direction and then in the opposite direction by a squarewave oscillator. This squarewave bias has no dc component. The operating characteristics of Josephson junctions are symmetric so the SQUID operates normally except during the relatively short transition time of the polarity reversal. The effect is to heterodyne the signal up to frequency bands centered around the squarewave frequency and its harmonics, which frequency is chosen to be well above any signal frequencies of interest, as well as the frequency at which the 1/f noise is significant.

BRIEF DESCRIPTION OF THE DRAWINGS

For a more complete understanding of the invention reference should be made to the accompanying drawings, wherein:

FIG. 1 is a schematic showing of a dc SQUID;

FIGS. 2 and 3 are graphical representations useful in explaining the operation of the present invention;

DETAILED DESCRIPTION

Figure 4:
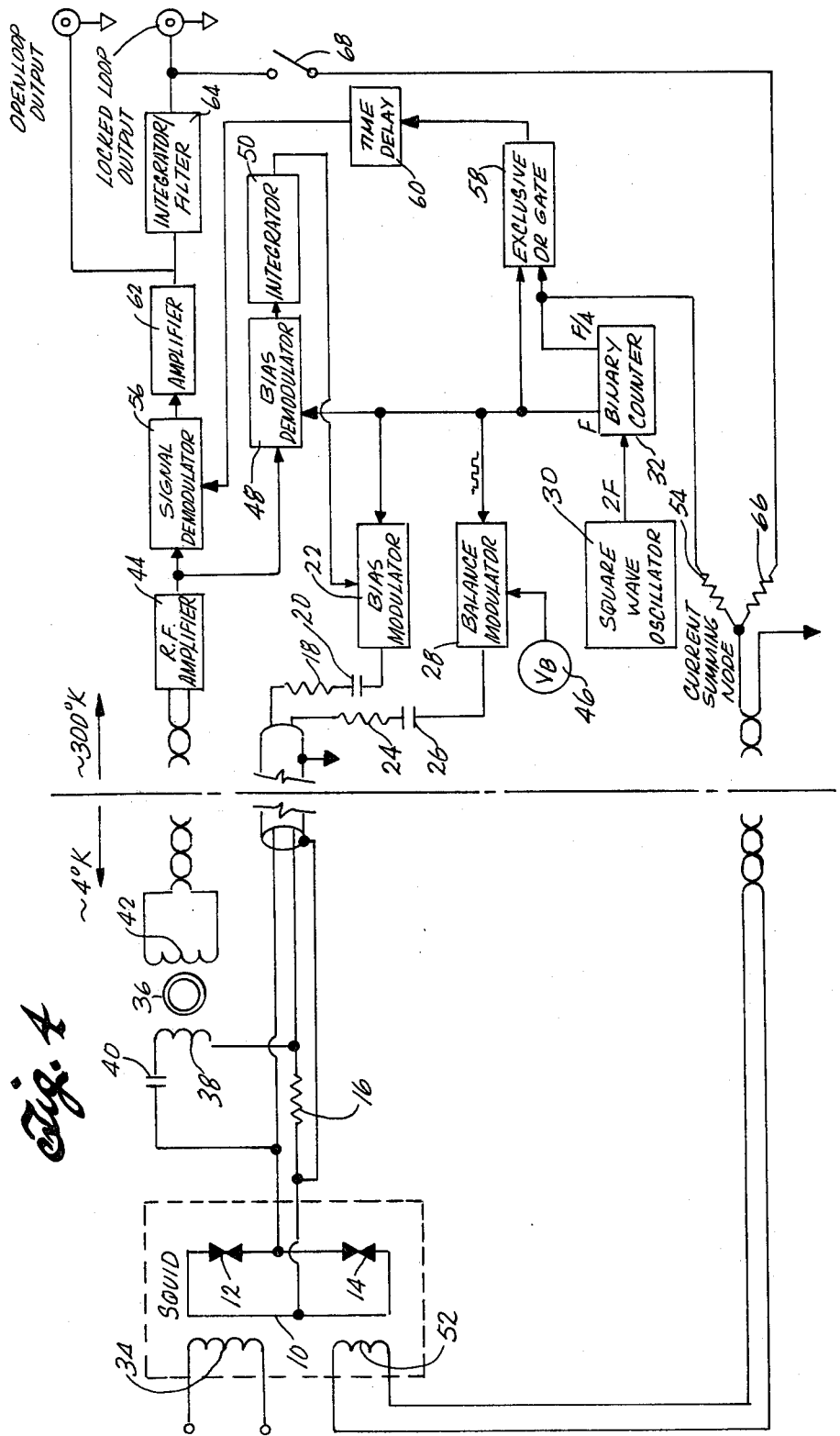
FIG. 4 is a schematic block diagram of the preferred embodiment of the present invention.

As described in detail in the above-identified publication and shown schematically in FIG. 1, the basic dc SQUID includes a low inductance superconducting loop 10 interrupted by two matched Josephson junctions 12 and 14. When a dc biasing current $I_B$ is passed through the two junctions in parallel, the voltage $V_J$ varies as a function of the magnetic flux $\Phi_A$ threading the ring. The voltage, in fact, is an oscillatory function of the flux in which one period corresponds to one flux quantum $\Phi_O$. FIG. 2 is graphical plot showing the change in the voltage $V_J$ as a function of the biasing current $I_B$. At an appropriate biasing current $I_O$, the voltage varies between two limits, indicated at A and C, as the flux varies between an integral number of flux quanta $n\Phi_O$ and an integral number plus a half quanta of flux $(n+\frac{1}{2})\Phi_O$. The oscillatory change of the voltage $V_J$ with changes in flux at a given bias current $I_O$ is shown in FIG. 3. Because of the symmetrical nature of the Josephson junctions, the same characteristic is observed at a bias current $-I_O$ of the same magnitude but of opposite polarity. The voltage across the junctions, of course, is reversed in polarity and has an average value $-V_O$ which varies between points B and D with changes in flux $\Phi$ threading the loop. As shown in FIG. 3, the voltage changes at the two operating points are opposite in phase.

Whereas in the past, it has been the practice to operate the dc SQUID at a substantially constant bias current level, the present invention utilizes a squarewave signal for generating the bias current $I_O$ so that the operating point is switched each half cycle of the squarewave between the levels $+I_O$ and $-I_O$. The frequency F of the squarewave is selected above the normal range of signals being measured and preferably is in the order of 0.5 megahertz. By periodically reversing the bias current, differential noise currents resulting from thermal fluctuations in the junctions are caused to reverse their phase at frequency F. Because the phase of the voltage $V_J$ as a function of flux is also reversed each time the bias current polarity changes, the net effect on the fluctuation noise due to the double phase reversal is that it is not mixed or heterodyned by the bias current switching. Actual signals in the form of flux changes linking the SQUID are heterodyned, however, and appear as side bands around the switching frequency F and its harmonics. Thus signal variations and noise fluctuations can be distinguished.

In the past it has been the practice to incorporate the dc SQUID in a feedback system. As described in the above publication, an ac magnetic field is applied to the SQUID by a feedback coil with a peak-to-peak amplitude of approximately $\frac{1}{2}\phi_O$. The ac signal developed across the junctions is detected with a lock-in at the fundamental frequency. The same ac signal which modulates the SQUID is used to demodulate the output signal after it is amplified.

The present invention superimposes the bias switching on the modulation and demodulation scheme used in the feedback loop. The preferred embodiment for implementing the invention is shown in detail in FIG. 4, which operates to both switch the bias and apply modulation to the SQUID and then demodulate the resulting mixture to recover the original input signal spectrum. The waveforms shown in FIG. 5 are useful in analyzing the operation of the circuit in the time domain.

Figure 5:
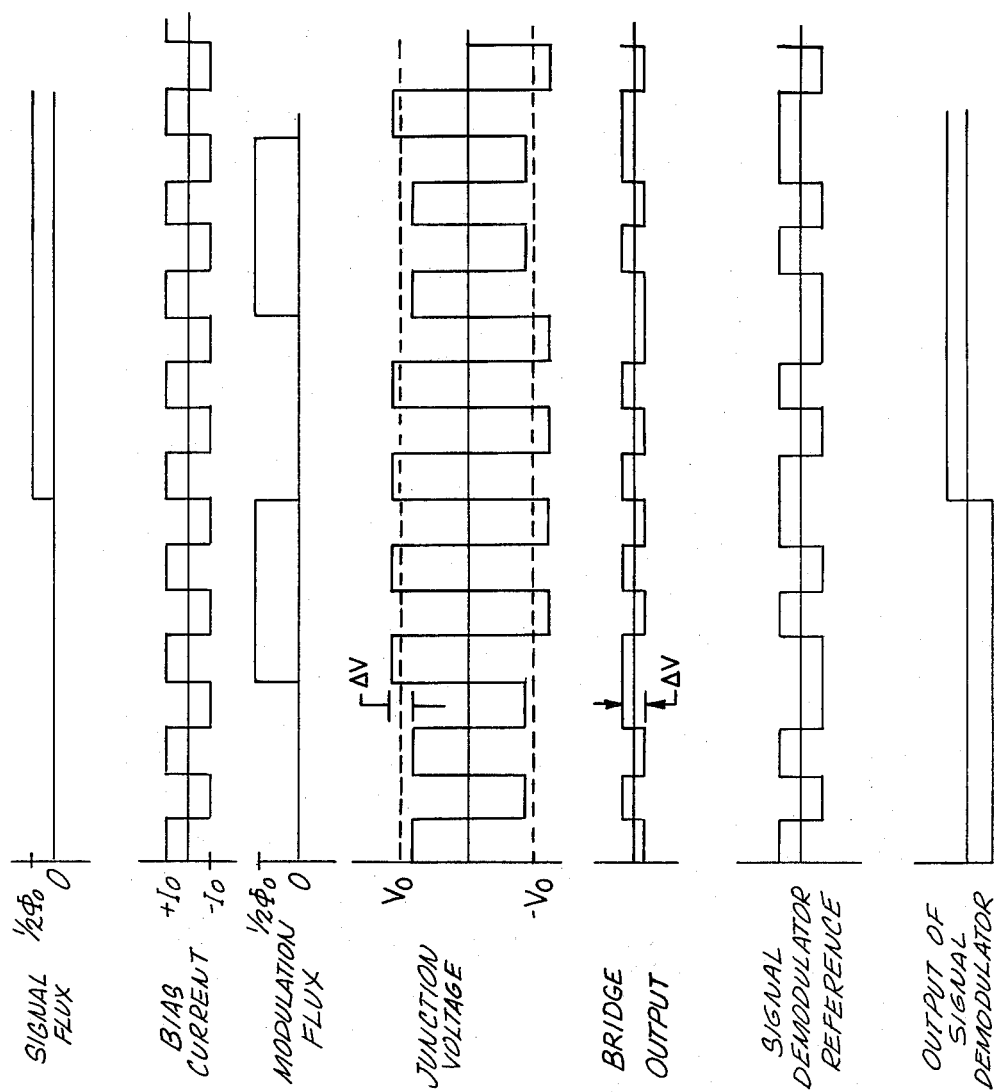
FIG. 5 is a timing diagram showing waveforms at various points in the circuit of FIG. 4.

Referring to FIG. 4 in detail, the SQUID, with its Josephson tunnel junctions 12 and 14 connected in a superconductive ring 10, is connected as one leg of a bridge circuit. A second adjacent leg of the bridge circuit is a resistor 16. The other two legs of the bridge circuit include respectively a resistor 18, capacitor 20 and bias modulator 22 forming one leg, and a resistor 24, capacitor 26 and balance modulator 28 forming the other leg. A squarewave voltage at frequency F is applied across one diagonal of the bridge by a squarewave oscillator 30 running at a frequency 2F and binary counter 32 which generates output squarewaves at frequencies F and F/4. The bias modulator 22 and balance modulator 28 function as adjustable impedances to balance the bridge, thereby nulling the large bias switching signal at frequency F before amplification by the RF amplifier 44.

The bias modulator 22 in combination with the resistor 18 and capacitor 20 controls the amplitude of the switched bias current driven in parallel through the Josephson junctions 12 and 14. The bias modulator 22 is controlled by a feedback circuit, described below. It automatically adjusts the amplitude of the switched current applied to the junctions, biasing them alternately between the average voltages $+V_O$ and $-V_O$, as shown in FIG. 2. The actual information signal is in the small amplitude variations around $+V_O$ and $-V_O$ which are induced by flux changes in the loop 10, such as by an input signal applied to an input coil 34 associated with the SQUID. These voltage variations are detected by an output transformer 36 whose primary winding 38 is connected through a blocking capacitor 40 across the other diagonal of the bridge circuit. The secondary winding 42 of the transformer is connected to an RF amplifier 44. Thus the carrier voltage appears as a common mode signal at the transformer input and is rejected while any variations of the junction voltage from the nominal values $\pm V_O$ appear differentially at the transformer and are amplified by the RF amplifier 44, that is, the circuit functions to subtract the voltage $\pm V_O$ from the output voltage signal across the junctions. The actual value of $V_O$ is set by adjusting the amplitude control 46 of the balance modulator 28.

Any carrier signal at frequency F which has been amplified by the RF amplifier 44 is demodulated by a bias demodulator 48. The output of the bias demodulator 48 is an error signal which is integrated by an integrator circuit 50 and applied to the bias modulator 22 to control the amplitude of the switched junction bias current. It should be noted that it would be possible to arrange this circuit to manually set the junction bias current and have the resulting junction voltage automatically balanced by controlling the current through the bridge leg 16. However, because the optimum operating voltage is less prone to variation than the optimum operating current, adjustment of the voltage as the independent variable is preferred. The time constant of the integrator 50 is made long enough so that negligible change can occur in the amplitude of the bias current $I_B$ during one period of the squarewave bias switching signal.

Flux modulation of amplitude $\frac{1}{2}\Phi_O$ and frequency F/4 is applied to the SQUID loop or ring 10 by means of a modulation coil 52 from the binary counter 32 through a current limiting resistor 54. After any squarewave signal at frequency F is balanced in the manner described above, the resulting signal is applied to a signal demodulator 56. An exclusive OR gate 58 and time delay circuit 60 are used to generate the proper reference signal from the F/4 output of the binary counter for the signal demodulator 56. The exclusive OR gate 58 operates to mix the two frequencies F and F/4 in exactly the same manner that the two signals are mixed by the SQUID. This operation can be better understood by reference to the timing diagrams in FIG. 5.

The output from the signal demodulator 56 is then amplified by an amplifier 62. The output of the amplifier can be used as an open loop output. In this case the output from the SQUID amplifier system will have a periodic character similar to the curve shown in FIG. 3. If a linear response is desired, the output of the amplifier may be applied to an integrator/filter circuit 64 and applied as a feedback signal through a resistor 66 to the feedback coil 52 by closing a switch 68. Thus a feedback loop is provided with the output being derived from the integrator/filter 64. It should be noted that, while a ratio of 4:1 between the switching frequency and the modulation frequency has been used, no particular ratio is required to make the circuit operate. This ratio was selected because it keeps the converted signal frequencies well separated from the bias switching frequency.

What is claimed is:

1. A low noise superconducting circuit for measuring magnetic flux comprising a superconducting device including a pair of Josephson junctions and superconductors connecting the junctions in a closed loop, means applying a bias current through the two junctions in parallel, means reversing the bias current direction through the junction periodically at a first frequency, means for generating magnetic flux linking the closed loop, means modulating said flux at a second frequency which is different from said first frequency, demodulating means responsive to reference signals at said first and second frequencies, and means coupling the voltage across said junctions to said demodulating means, the demodulated output providing an output signal whose amplitude is determined by the level of magnetic flux linking the loop.

2. Apparatus of claim 1 wherein said means applying a bias current and said means coupling the voltage across said junctions to the demodulating means include a common bridge circuit having the junctions connected in parallel as a first arm of the bridge, impedance means having one end connected to one end of the parallel connected junctions as an adjacent second arm of the bridge, and variable impedance means connected respectively to the other end of the parallel connected junctions and to the other end of the impedance means as each of the remaining third and fourth arms of the bridge, said means reversing the bias current direction including an oscillator oscillating at said first frequency being connected across one diagonal of the bridge between the junction of the first and second arms and the junction of the third and fourth arms, and means coupling the input to the demodulator means across the other diagonal of the bridge between the junction of the first and third arms and the junction of the second and fourth arms.

3. Apparatus of claim 2 wherein said voltage adjustment means includes amplitude modulating means in each of said remaining arms of the bridge for adjusting the current amplitude through the parallel junctions and through said impedance means to balance the bridge.

4. Apparatus of claim 3 further comprising means including a second demodulation means connected across said other diagonal of the bridge and to a reference signal at said first frequency for demodulating the signal component present at said first frequency, feedback means responsive to the output of the second demodulation means for controlling the amplitude modulation means in one of said bridge arms.

5. Apparatus of claim 2 further including means responsive to said output signal of said first mentioned demodulation means for controlling the level of the flux applied to the loop.

6. A control circuit for a dc SQUID having a pair of Josephson junctions connected in a superconductive loop, comprising means for applying a bias current through the pair of junctions in parallel forming said loop, means reversing the polarity of the bias current periodically at a first predetermined frequency, modulation means for producing modulation flux linking the loop at a second predetermined frequency, and means coupled across the junctions in parallel for generating an output signal that varies in magnitude in response to changes in the voltage across said two junctions in parallel due to changes in the level of flux linking the loop.

7. Apparatus of claim 6 wherein said means for generating an output signal includes means subtracting a voltage at said first frequency from the voltage across said junctions.

8. Apparatus of claim 7 further including means responsive to the output from said subtracting means for demodulating the output to remove the second predetermined frequency from said output.

9. Apparatus of claim 7 wherein said subtracting means comprises a bridge circuit having four impedance arms, the loop and pair of junctions in parallel connected as one arm of the bridge, and said means applying a bias current including a squarewave source connected across one diagonal of the bridge.

10. Apparatus of claim 9 wherein said modulation means includes carrier source of said second predetermined frequency, the carrier source being a squarewave source having a frequency that is integrally related to the frequency of the bias current.

11. Apparatus of claim 10 wherein the bias current frequency is four times the modulation carrier frequency.

12. Apparatus for measuring magnetic flux comprising:
a superconducting device including a pair of Josephson junctions and superconductors connecting the junctions in parallel to form a closed loop, means connecting a periodically reversing bias current through said junctions at a first frequency, means generating magnetic flux linking the closed loop, means periodically changing the level of said flux at a second frequency, demodulation means responsive to the changes in voltage across said junctions, and means mixing signals at said first and second frequencies for providing a reference signal to said demodulating means, whereby the output of the demodulating means is a measure of the level of magnetic flux linking the closed loop.

13. Apparatus of claim 12 further including feedback means responsive to the output of the demodulation means for adjusting the level of flux linking the closed loop.

14. Apparatus of claim 12 wherein said means connecting a periodically reversing bias current includes means generating a squarewave at said first frequency, and said means periodically changing the level of said flux includes means generating a squarewave at said second frequency, the ratio of the first frequency to the second frequency being a ratio of two integers.

15. Apparatus of claim 14 wherein said mixing means includes an exclusive OR circuit.

* * * * *